(12) United States Patent
Kyuutoku

(10) Patent No.: US 8,030,159 B2
(45) Date of Patent: Oct. 4, 2011

(54) METHOD OF FABRICATING EEPROM

(75) Inventor: Shinji Kyuutoku, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/461,494

(22) Filed: Aug. 13, 2009

(65) Prior Publication Data

US 2010/0047981 A1    Feb. 25, 2010

(30) Foreign Application Priority Data

Aug. 19, 2008    (JP) ................................ 2008-210693

(51) Int. Cl.
*H01L 21/336* (2006.01)

(52) U.S. Cl. ........ 438/257; 438/258; 438/263; 438/264; 257/314; 257/315; 257/E27.059; 257/E27.06

(58) Field of Classification Search .................. 438/263, 438/264, 266, 257, 258; 257/314, 315, E27.059, 257/E27.06

See application file for complete search history.

(56) References Cited

U.S. PATENT DOCUMENTS 6,506,646 B1 * 1/2003 Miyagi .................. 438/257
6,680,225 B2 * 1/2004 Miyagi .................. 438/199

FOREIGN PATENT DOCUMENTS

JP    2001-210730 A    8/2001

* cited by examiner

*Primary Examiner* — Hsien Ming Lee
(74) *Attorney, Agent, or Firm* — Rabin & Berdo, PC

(57) ABSTRACT

There is provided a method of fabricating an EEPROM for forming a memory cell transistor and a selection transistor, the method includes: forming a first source region and a first drain region of the memory cell transistor; forming a first gate oxide film; forming a resist having at least one through hole on the first gate oxide film; adding conductivity type impurities through the through hole; partially removing the first gate oxide film and forming a tunnel oxide film in a region corresponding to the through hole; forming a floating gate electrode and a second gate oxide film formed on the floating gate electrode; forming a control gate electrode and a selection transistor gate electrode on the second gate oxide film and at a region in which the selection transistor is formed; and forming a second source region and a second drain region of the selection transistor.

12 Claims, 7 Drawing Sheets

METHOD OF FABRICATING EEPROM

CROSS-REFERENCE TO RELATED APPLICATION

This application is based on and claims priority under 35 USC 119 from Japanese Patent Application No. 2008-210693 filed on Aug. 19, 2008, the disclosure of which is incorporated by reference herein.

BACKGROUND

1. Technical Field

The present invention relates to a method of fabricating an EEPROM as a non-volatile semiconductor memory which can electrically write and erase data.

2. Related Art

When battery power is insufficient in portable mobile electronic equipments represented by a mobile phone, PDA (personal digital assistant: mobile information terminal), a notebook type computer, and a music player, they rely on a non-volatile semiconductor memory to hold data and a program. As ordinary non-volatile semiconductor memories, there are known an ultra-violet erasable EPROM (Ultra-Violet Erasable Programmable Read Only Memory) which can erase stored contents by radiating ultraviolet rays and an EEPROM (Electrically Erasable Programmable Read Only Memory) which can electrically write and erase data.

As shown in FIG. 4, the EEPROM ordinarily has such a structure such that a memory cell transistor 102 and a selection transistor 103 are formed on a Si substrate 101. The memory cell transistor 102 is composed of diffusion layers 104, 105, gate oxide films 106a, 106b, a tunnel oxide film 107, a floating gate electrode 108, and a control gate electrode 109. In the configuration, the diffusion layer 104 acts as a source and the diffusion layer 105 acts as a drain. The selection transistor 103 is composed of the diffusion layer 105, a diffusion layer 110, a gate oxide film 111, and a gate electrode 112. In the configuration, the diffusion layer 105 acts as a source and the diffusion layer 110 acts as a drain.

In fabricating the EEPROM 100 configured as described above, a problem arises in that it is difficult to miniaturize the EEPROM 100 because an allowance must be provided in design taking an alignment offset in photolithography into consideration because the tunnel oxide film 107 is formed on the diffusion layer 105. A method of solving the problem is disclosed in Japanese Patent Application Laid-Open (JP-A) No. 2001-210730.

As to formation of a tunnel oxide film to an EEPROM, JP-A No. 2001-210730 discloses to form a resist having a through hole for exposing a forming region on a semiconductor substrate through the through hole, to add conductive impurities to the substrate through the through hole, and thereafter to form the tunnel oxide film to the forming region by removing the resist. The method makes it unnecessary to adjust a tunnel oxide film forming region in alignment with a predetermined position of a diffusion layer which is previously formed on a semiconductor substrate as in a conventional method.

However, in the method of fabricating the EEPROM disclosed in JP-A No. 2001-210730, a source region of a memory cell is only formed just under the tunnel oxide film, and the source region of the memory cell is not connected to a source region of a selection transistor by a diffusion region having a high impurity concentration. Further, since the source region of the memory cell is formed after a control gate is formed, there is a possibility that it cannot be accurately formed at a desired position.

SUMMARY

An object of the present invention, which was made in view of the above circumstances, is to provide a method of fabricating an EEPROM in which a memory cell transistor is securely connected to a selection transistor by a diffusion region having a high impurity concentration.

To solve the problems described above, one aspect of the present invention provides a method of fabricating, on a semiconductor substrate, an EEPROM for forming a memory cell transistor and a selection transistor that is a component of the memory cell transistor and the EEPROM, the method including:

forming a first source region and a first drain region of the memory cell transistor on the semiconductor substrate;

forming a first gate oxide film on the semiconductor substrate;

forming a resist having at least one through hole on the first gate oxide film formed on the first drain region;

adding conductivity type impurities to the semiconductor substrate, on which the resist is formed, through the through hole;

partially removing the first gate oxide film using the resist and forming a tunnel oxide film in a region corresponding to the through hole;

forming a floating gate electrode, which covers the tunnel oxide film and parts of the first source region and the first drain region, and a second gate oxide film formed on the floating gate electrode;

forming a control gate electrode and a selection transistor gate electrode on the second gate oxide film and at a region in which the selection transistor is formed; and forming a second source region and a second drain region of the selection transistor on the semiconductor substrate, wherein the first drain region is connected to the second source region by partial overlapping.

Further, to solve the problems described above, another aspect of the present invention provides a method of fabricating, on a semiconductor substrate, an EEPROM for forming a memory cell transistor and a selection transistor that is a component of the memory cell transistor and the EEPROM, the method including:

forming a first source region and a first drain region of the memory cell transistor on the semiconductor substrate;

forming a first gate oxide film on the semiconductor substrate;

forming a resist having at least one through hole on the first gate oxide film formed on the first drain region;

adding conductivity type impurities to the semiconductor substrate, on which the resist is formed, through the through hole;

forming a tunnel oxide film by partially adjusting the first gate oxide film to a predetermined thickness using the resist;

forming a floating gate electrode, which covers the tunnel oxide film and parts of the first source region and the first drain region, and a second gate oxide film formed on the floating gate electrode;

forming a control gate electrode and a selection transistor gate electrode on the second gate oxide film and at a region in which the selection transistor is formed; and forming a second source region and a second drain region of the selection transistor on the semiconductor substrate, wherein the first drain region is connected to the second source region by partial overlapping.

After source and drain regions of the memory cell transistor are formed on the semiconductor substrate and gate electrode structures of the memory cell transistor and the selection transistor are formed on the semiconductor substrate, a source region of the selection transistor is formed by being partially overlapped with the drain region of the memory cell transistor. As a result, there is provided a method of fabricating an EEPROM in which the memory cell transistor is securely connected to the selection transistor by a diffusion region having a high impurity concentration.

Still further aspect of the present invention provides a method of fabricating, on a semiconductor substrate, an EEPROM for forming a memory cell transistor and a selection transistor that is a component of the memory cell transistor and the EEPROM, the method including:

forming a first source region and a first drain region of the memory cell transistor on the semiconductor substrate;

forming a first gate oxide film on the semiconductor substrate;

forming a resist having at least one through hole on the first gate oxide film formed on the first drain region;

adding conductivity type impurities to the semiconductor substrate, on which the resist is formed, through the through hole;

forming a tunnel oxide film at the bottom of an opening in the through hole;

forming a floating gate electrode, which covers the tunnel oxide film and parts of the first source region and the first drain region, and a second gate oxide film formed on the floating gate electrode;

forming a control gate electrode and a selection transistor gate electrode on the second gate oxide film and at a region in which the selection transistor is formed; and forming a second source region and a second drain region of the selection transistor on the semiconductor substrate, wherein the first drain region is connected to the second source region by partial overlapping.

BRIEF DESCRIPTION OF THE DRAWINGS

Exemplary embodiment of the present invention will be described in detail based on the following figures, wherein.

DETAILED DESCRIPTION

An embodiment of the present invention will be explained below in detail referring to the accompanying drawings below.

First, a structure of an EEPROM fabricated by a method of fabricating the EEPROM of the embodiment of the invention will be explained in detail referring to FIG. 1.

Figure 1:
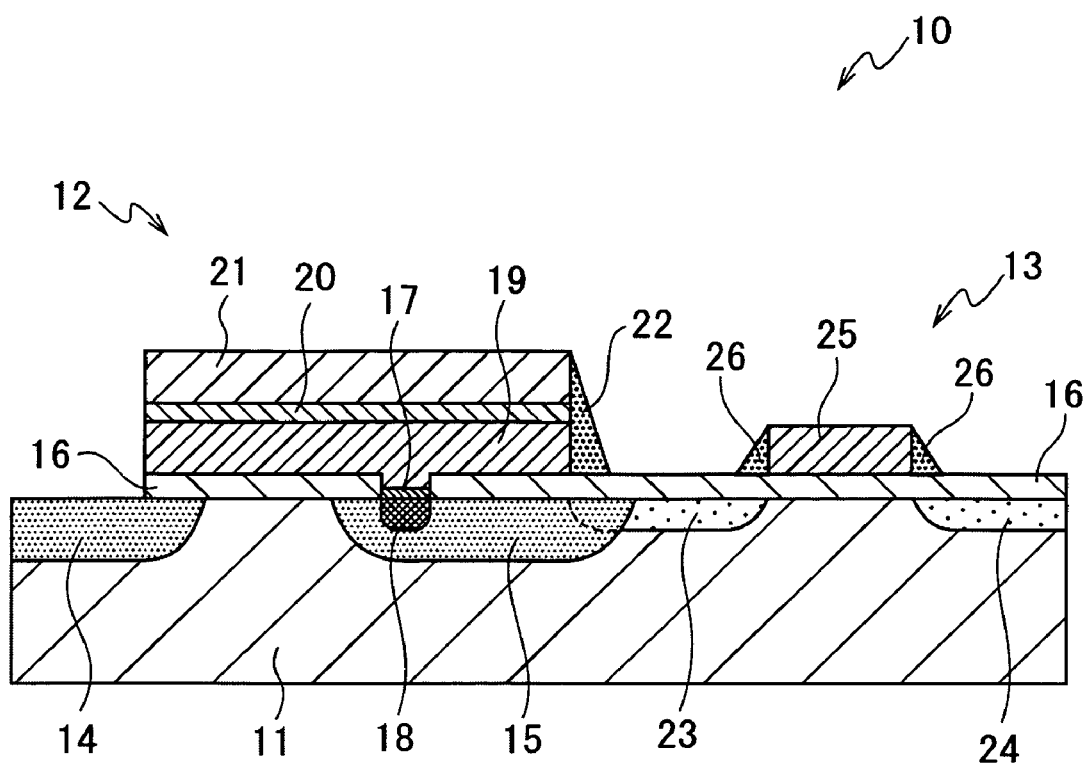
FIG. 1 is a sectional view of an EEPROM fabricated by a method of fabricating the EEPROM as a first embodiment of the present invention.

As shown in FIG. 1, a memory cell transistor 12 and a selection transistor 13 are formed on a Si substrate 11 as a P-type semiconductor substrate.

The memory cell transistor 12 uses an N-type first diffusion layer 14 formed on the Si substrate 11 as a source and an N-type second diffusion layer 15 as a drain. A first gate oxide film 16 is formed on a part of the first diffusion layer 14 and on the second diffusion layer 15. The first gate oxide film 16 has an opening in a part thereof. A tunnel oxide film 17 having a film thickness thinner than that of the first gate oxide film 16 is formed in the opening. The second diffusion layer 15 has a high concentration diffusion layer 18 which has conductive impurities whose concentration is higher than that of the other portion and is formed just under the tunnel oxide film 17 (i.e., in a portion confronting the tunnel oxide film 17). A floating gate electrode 19 is formed on a part of the first gate oxide film 16 and on the tunnel oxide film 17. A control gate electrode 21 is formed on the floating gate electrode 19 through a second gate oxide film 20. Further, a side wall 22 is formed to sides of the floating gate electrode 19, the second gate oxide film 20, and the control gate electrode 21. The memory cell transistor 12 is composed of the Si substrate 11, the first and second diffusion layers 14, 15, the first gate oxide film 16, the tunnel oxide film 17, the high concentration diffusion layer 18, the floating gate electrode 19, the second gate oxide film 20, and the control gate electrode 21 described above. Note that a silicon oxide film, for example, is exemplified as the first gate oxide film 16. A silicon oxide film, for example, is exemplified as the second gate oxide film 20, and further the second gate oxide film 20 may be a so-called ONO film formed by sequentially laminating a silicon oxide film, a silicon nitride film, a silicon oxide film.

The selection transistor 13 is formed on the Si substrate 11 and uses an N-type low concentration diffusion layer 23 connected to the second diffusion layer 15 as a source and an N-type low concentration diffusion layer 24 as a drain. The first gate oxide film 16 is formed on the low concentration diffusion layers 23, 24. A selection transistor gate electrode (hereinafter, simply called a gate electrode) 25 is formed on a part of the first gate oxide film 16, and a side wall 26 is formed on a side of the gate electrode 25. The selection transistor 13 is composed of the Si substrate 11, the low concentration diffusion layers 23, 24, the gate electrode 25, and the side wall 26.

Note that although the memory cell transistor 12 and the selection transistor 13 share the first gate oxide film 16, the first gate oxide film 16 may be preferably formed separately from a view point of design and fabricating steps. Further, the memory cell transistor 12 and the selection transistor 13 may be preferably formed on an N-type semiconductor substrate, and in this case, the relation between a P-type and an N-type is entirely reversed.

Next, the method of fabricating the EEPROM 10 as the embodiment of the invention will be explained in detail referring to FIG. 2A to FIG. 3C.

Figure 2A:
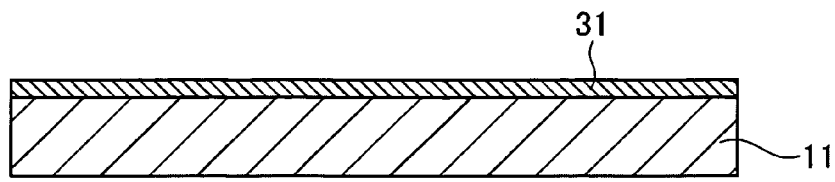
FIGS. 2A to 2K are sectional views of the EEPROM at respective steps of the method of fabricating the EEPROM as the first embodiment of the invention.

First, after an element isolation region (not shown) is formed on the Si substrate 11 using a device isolation technique such as a LOCOS (Local Oxidation of Silicon) method and the like, an oxide film 31 is formed by a thermal oxidation method and the like (FIG. 2A).

Figure 2B:
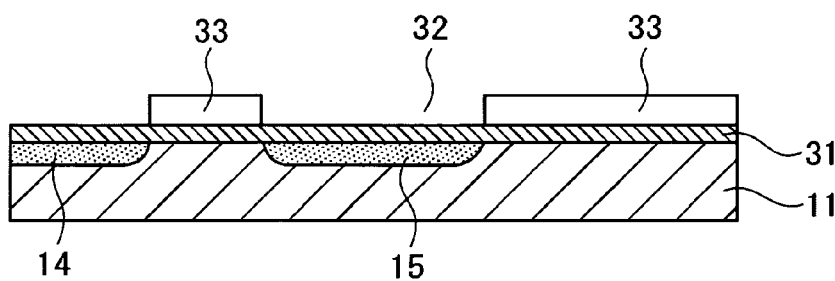

Next, a resist 33 is coated on the oxide film 31. The resist 33 is patterned by lithography so that a through hole 32 is formed. N-type conductive impurities such as arsenide (As) and the like are added using the patterned resist 33 as a mask, (for example, they may be ion implanted), thereby the first and second diffusion layers 14, 15 are formed (FIG. 2B). The step is called a source/drain forming step.

Figure 2C:
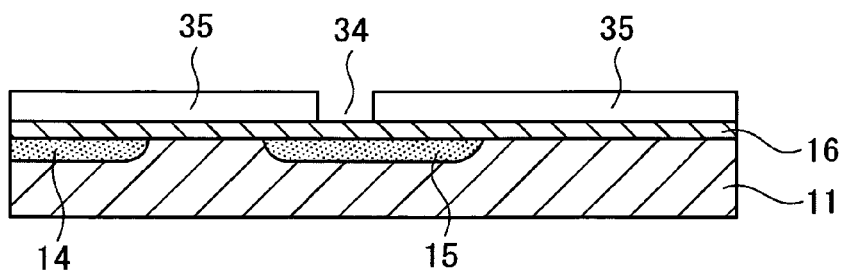

Next, after the resist 33 and the oxide film 31 are removed, the first gate oxide film 16, which acts as gate oxide films of the memory cell transistor 12 and the selection transistor 13, are newly formed by thermal oxidation method and the like. The step is called an oxide film forming step. Next, a resist 35 is coated on the first gate oxide film 16. The resist 35 is patterned by the lithography so that a through hole 34 is formed (FIG. 2C). The step is called a resist forming step.

Figure 2D:
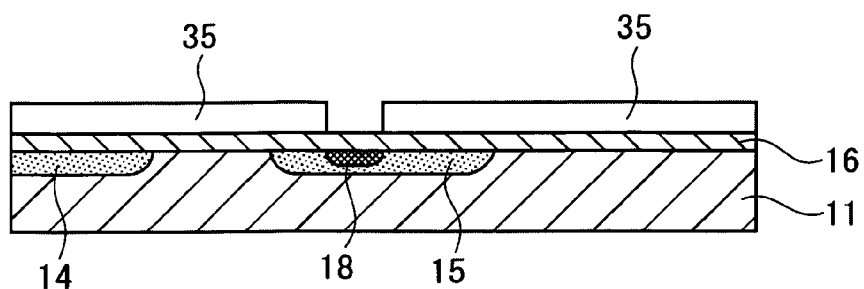

Next, conductive impurities such as arsenide (As) and the like are ion implanted using the patterned resist 35 as a mask (i.e., through the through hole 34) so that the high concentration diffusion layer 18 having a high impurity concentration is formed to a part in the second diffusion layer 15 (FIG. 2D). The step is called an impurity adding step, and the conductive impurities may be ion implanted vertically to, for example, the bottom of the opening of the through hole 34.

Further, a method of ion implanting the conductive impurities as described below may be used.

Figure 3A:
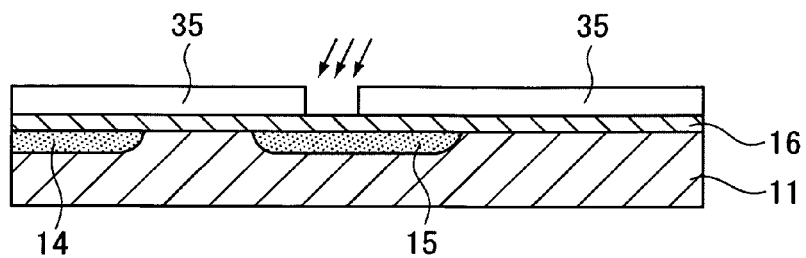
FIGS. 3A to 3C are sectional views showing a method of adding conductivity type impurities in the method of fabricating the EEPROM as the first embodiment of the invention.

First, as shown in FIG. 3A, the conductive impurities are ion implanted in a direction oblique to the through hole 34 (for example, in a lower left direction in FIG. 3A). The step is called an adding step.

Figure 3B:
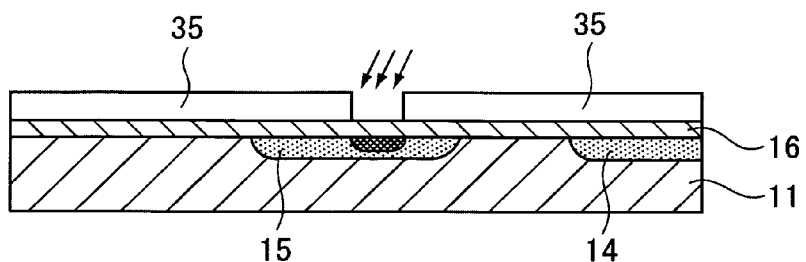

Next, the Si substrate 11 is rotated a predetermined angle (may be for example, 90° or 180°, and FIG. 3B shows a case that it is rotated 180°) using a central portion of the Si substrate 11 as an axis of rotation. The step is called a rotation step. After the Si substrate 11 is rotated, the conductive impurities are ion implanted again by the same method as that described above (FIG. 3B).

Figure 3C:
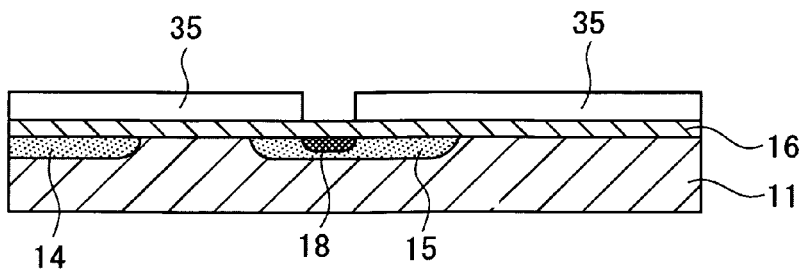
Figure 4:
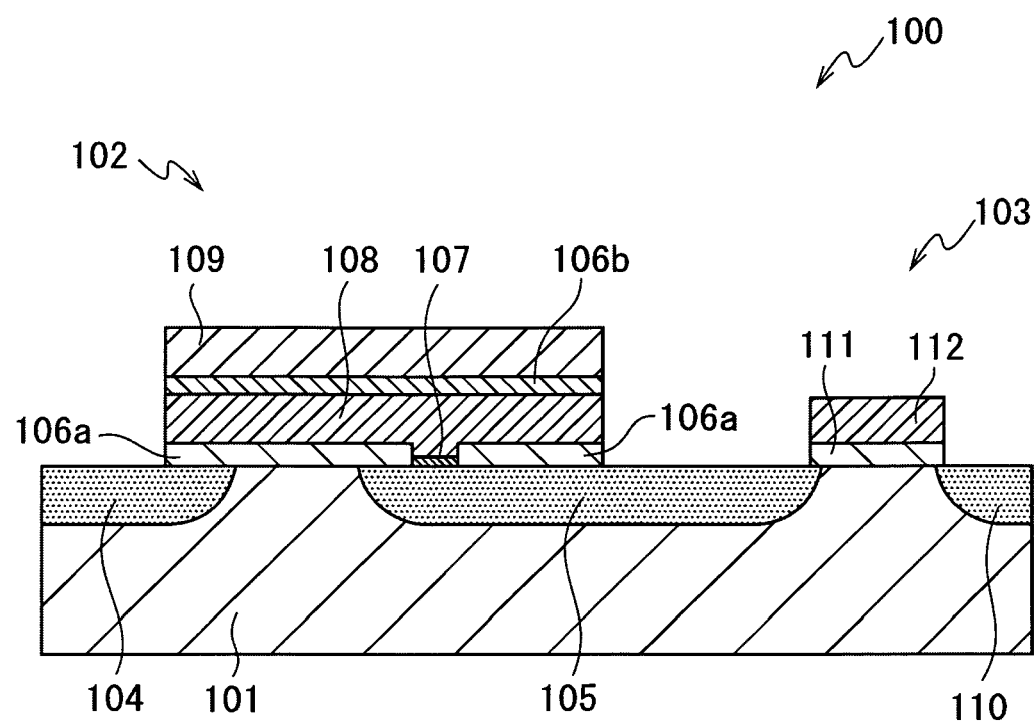
FIG. 4 is a sectional view of a conventional EEPROM.

A desired high concentration diffusion layer 18 can be formed by repeating the implantation step and the rotation step (FIG. 3C). When the method described above is used, since the area of the high concentration diffusion layer 18 is more increased than the case in which the conductive impurities are ion implanted vertically to the bottom of the opening of through hole 34, stable write characteristics can be obtained because an edge of the tunnel oxide film 17 does not come into contact with the diffusion region having a small impurity concentration.

Further, the addition step described above may be executed while rotating the Si substrate 11. This is because the conductive impurities can be more uniformly distributed in the high concentration diffusion layer 18.

Figure 2E:
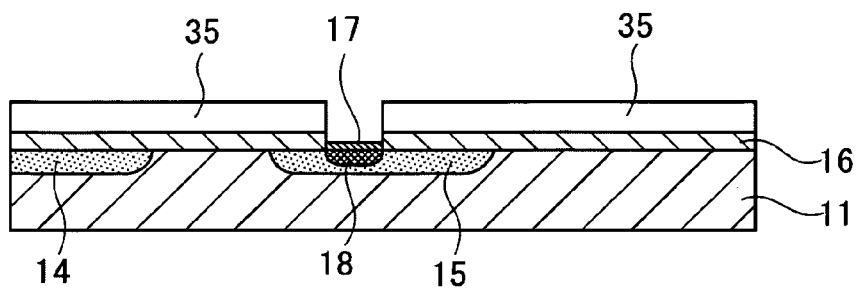

After the high concentration diffusion layer 18 is formed, the first gate oxide film 16 exposed through the through hole 34 is removed using the patterned resist 35. The tunnel oxide film 17 is formed by forming a new oxide film having a film thickness thinner than that of the first gate oxide film 16 to the portion, from which the exposed first gate oxide film 16 is removed, by the thermal oxidation method and the like (FIG. 2E). Further, as another method, the tunnel oxide film 17 may be preferably formed by flowing an etching solution to the through hole 33 and etching the first gate oxide film 16 in the bottom of the opening of the through hole 33 to a predetermined thickness. Note that, in this case, only the portion of the first gate oxide film 16 positioning in the bottom of the opening of the through hole 33 is made thin and arranged as the tunnel oxide film 17. The step is called a tunnel oxide film forming step.

Figure 2F:
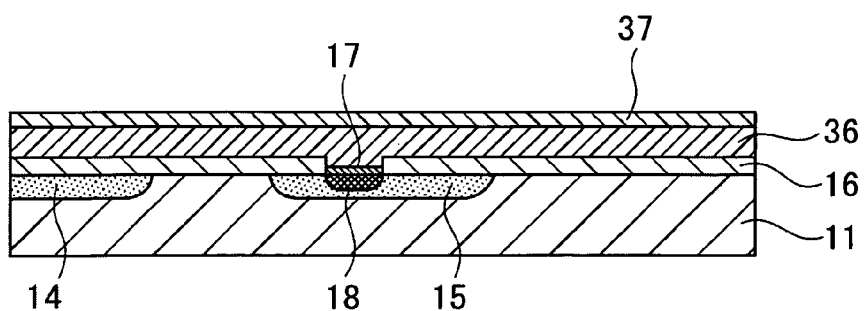

Next, after the resist 35 is removed, a polysilicon layer 36 acting as the floating gate electrode 19 of the memory cell transistor is formed, and an oxidation layer 37 is formed on the polysilicon layer 36 (FIG. 2F). The polysilicon layer 36 and the oxidation layer 37 may be preferably formed using, for example, the thermal oxidation method and a CVD method.

Figure 2G:
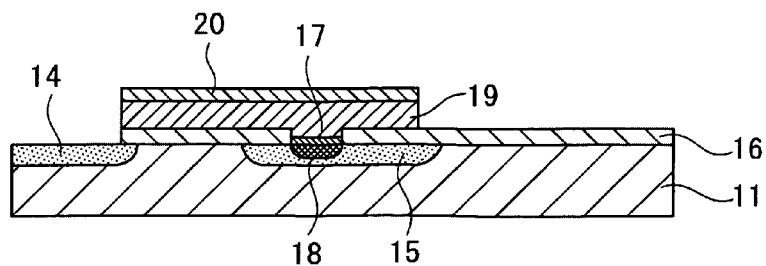

Next, a resist (not shown) is coated on the oxidation layer 37. The coated resist is patterned by the lithography. Etching is executed using the resist after it is patterned as a mask so that the floating gate electrode 19 and the second gate oxide film 20 are formed (FIG. 2G). The step is called a floating gate portion forming step. Note that the unnecessary first gate oxide film 16 may be removed in the step. The position of the unnecessary first gate oxide film 16 is different depending the difference in the design and the fabricating steps of the EEPROM 10.

Figure 2H:
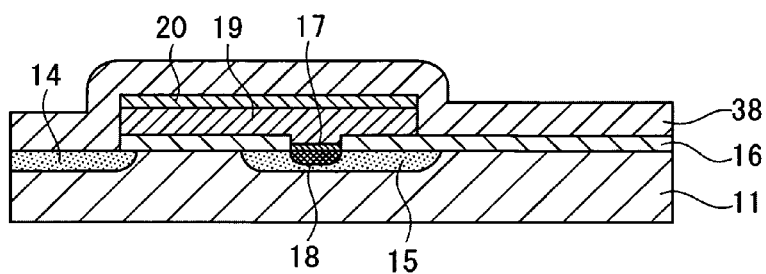

Next, a laminated film 38 acting as the control gate electrode 21 of the memory cell transistor 12 and as the gate electrode 25 of the selection transistor is formed (FIG. 2H). The laminated film 38 may be, for example, polysilicon-tungsten silicide formed by the CVD.

Figure 2I:
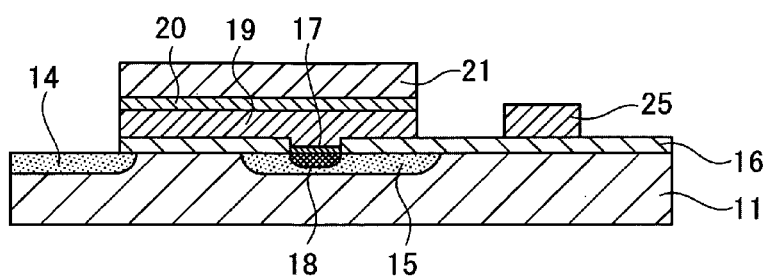

Next, a resist (not shown) is coated on the laminated film 38. The coated resist is patterned by the lithography. The laminated film 38 is etched using the resist after it is patterned as a mask so that the control gate electrode 21 and the gate electrode 25 are formed (FIG. 2I). As illustrated in FIG. 2I, the control gate electrode 21 is formed on the second gate oxide film 20, and the selection cell transistor gate electrode 25 is formed on the first gate oxide film 16 and at a region in which the selection transistor is formed (see also FIG. 1). Note that the unnecessary first gate oxide film 16 may be removed in the step.

Figure 2J:
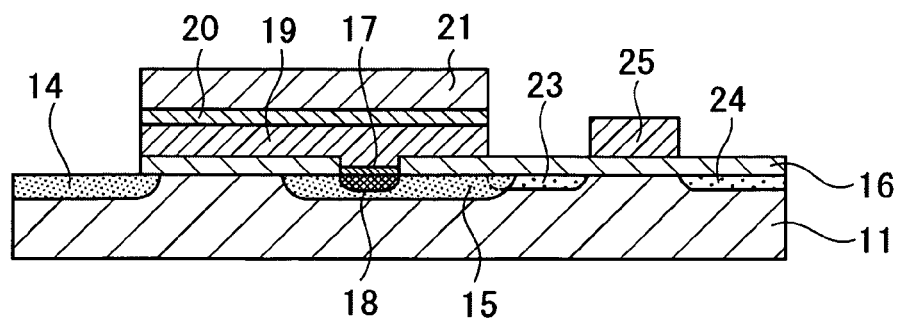

Next, to form a source and a drain of the selection transistor 13, conductivity type impurities, for example, phosphorus and the like are ion implanted so that the low concentration diffusion layers 23, 24 are formed (FIG. 2J). The low concentration diffusion layer 23 is formed by being connected to the second diffusion layer 15, and the impurity concentration of the low concentration diffusion layers 23, 24 is set smaller than that of the first diffusion layers 14, 15. Further, the low concentration diffusion layer 23 acts as the source, and the low concentration diffusion layer 24 acts as the drain.

Figure 2K:
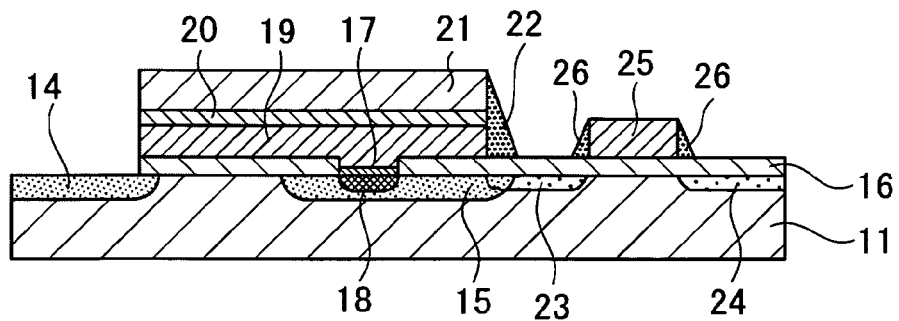

Next, the side wall 22 is formed on the sides of the floating gate electrode 19, the second gate oxide film 20, and the control gate electrode 21 which constitute the memory cell transistor 12, and the side wall 26 is formed on the side of the gate electrode 25 of the selection transistor 13 (FIG. 2K). Further, a high concentration diffusion layer (not shown) and a contact electrode (not shown) connected thereto may be formed after the side walls 22, 26 are formed.

As described above, according to the method of fabricating the EEPROM of the embodiment, after the first and second diffusion layers 14, 15 acting as the source and drain regions of the memory cell transistor 12 are formed on the Si substrate 11 and gate electrode structures of the memory cell transistor 12 and the selection transistor 13 are formed on the Si substrate 11, the low concentration diffusion layer 23, which is the source region of the selection transistor 13, is formed by being partially overlapped with the second diffusion layer 15 which is the drain region of the memory cell transistor 12. As a result, the memory cell transistor 12 can be securely connected to the selection transistor 13 by the diffusion region having the high impurity concentration.

What is claimed is:

1. A method of fabricating, on a semiconductor substrate, an EEPROM for forming a memory cell transistor and a selection transistor that is a component of the memory cell transistor and the EEPROM, the method comprising:

forming a first source region and a first drain region of the memory cell transistor on the semiconductor substrate;

forming a first gate oxide film on the semiconductor substrate;

forming a resist having at least one through hole on the first gate oxide film formed on the first drain region;

adding conductivity type impurities to the semiconductor substrate, on which the resist is formed, through the through hole;

partially removing the first gate oxide film using the resist as an etching mask to form a tunnel oxide film in a region corresponding to the through hole;

forming a floating gate electrode, which covers the tunnel oxide film and parts of the first source region and the first drain region, and a second gate oxide film formed on the floating gate electrode;

forming a control gate electrode on the second gate oxide film, and forming a selection transistor gate electrode on the first gate oxide film and at a region in which the selection transistor is formed; and forming a second source region and a second drain region of the selection transistor on the semiconductor substrate, wherein the first drain region is connected to the second source region by partial overlapping.

2. The method of claim 1, wherein the tunnel oxide film is formed at the bottom of an opening of the through hole after the resist is removed.

3. The method of claim 2, further comprising repetition of obliquely adding the conductivity type impurities to the through hole and of rotating the semiconductor substrate using a central portion thereof as an axis of rotation.

4. The method of claim 2, further comprising obliquely adding the conductivity type impurities to the through hole while rotating the semiconductor substrate using a central portion thereof as an axis of rotation.

5. The method of claim 1, further comprising repetition of obliquely adding the conductivity type impurities to the through hole and of rotating the semiconductor substrate using a central portion thereof as an axis of rotation.

6. The method of claim 1, further comprising obliquely adding the conductivity type impurities to the through hole while rotating the semiconductor substrate using a central portion thereof as an axis of rotation.

7. A method of fabricating, on a semiconductor substrate, an EEPROM for forming a memory cell transistor and a selection transistor that is a component of the memory cell transistor and the EEPROM, the method comprising:

forming a first source region and a first drain region of the memory cell transistor on the semiconductor substrate;

forming a first gate oxide film on the semiconductor substrate;

forming a resist having at least one through hole on the first gate oxide film formed on the first drain region;

adding conductivity type impurities to the semiconductor substrate, on which the resist is formed, through the through hole;

forming a tunnel oxide film by partially adjusting the first gate oxide film to a thickness using the resist as a mask;

forming a floating gate electrode, which covers the tunnel oxide film and parts of the first source region and the first drain region, and a second gate oxide film formed on the floating gate electrode;

forming a control gate electrode on the second gate oxide film, and forming a selection transistor gate electrode on the first gate oxide film and at a region in which the selection transistor is formed; and forming a second source region and a second drain region of the selection transistor on the semiconductor substrate, wherein the first drain region is connected to the second source region by partial overlapping.

8. The method of claim 7, comprising repetition of obliquely adding the conductivity type impurities to the through hole and of rotating the semiconductor substrate using a central portion thereof as an axis of rotation.

9. The method of claim 7, comprising obliquely adding the conductivity type impurities to the through hole while rotating the semiconductor substrate using a central portion thereof as an axis of rotation.

10. A method of fabricating, on a semiconductor substrate, an EEPROM for forming a memory cell transistor and a selection transistor that is a component of the memory cell transistor and the EEPROM, the method comprising:

forming a first source region and a first drain region of the memory cell transistor on the semiconductor substrate;

forming a first gate oxide film on the semiconductor substrate;

forming a resist having at least one through hole on the first gate oxide film formed on the first drain region;

adding conductivity type impurities to the semiconductor substrate, on which the resist is formed, through the through hole;

forming a tunnel oxide film at the bottom of an opening in the through hole;

forming a floating gate electrode, which covers the tunnel oxide film and parts of the first source region and the first drain region, and a second gate oxide film formed on the floating gate electrode;

forming a control gate electrode on the second gate oxide film, and forming a selection transistor gate electrode on the first gate oxide film and at a region in which the selection transistor is formed; and forming a second source region and a second drain region of the selection transistor on the semiconductor substrate, wherein the first drain region is connected to the second source region by partial overlapping.

11. The method of claim 10, further comprising partially removing the first gate oxide film using the resist as an etching mask to form the tunnel oxide film in the bottom of the opening of the through hole after the resist is removed.

12. The method of claim 10, wherein the tunnel oxide film is formed by adjusting the oxide film to a predetermined thickness by etching.

* * * * *